(12) United States Patent
Leconte et al.

(10) Patent No.: US 7,079,448 B2
(45) Date of Patent: Jul. 18, 2006

(54) WORD-PROGRAMMABLE FLASH MEMORY

(75) Inventors: Bruno Leconte, Rousset (FR); Paola Cavaleri, Rousset (FR); Sébastien Zink, Aix en Provence (FR)

(73) Assignee: STMicroelectronics S.A., Montrouge (FR)

(*) Notice: Subject to any disclaimer, the term of this patent is extended or adjusted under 35 U.S.C. 154(b) by 117 days.

(21) Appl. No.: 10/867,381

(22) Filed: Jun. 14, 2004

(65) Prior Publication Data

US 2005/0024952 A1    Feb. 3, 2005

(30) Foreign Application Priority Data

Jun. 12, 2003  (FR) ................................. 03 07050

(51) Int. Cl.
G11C 13/04    (2006.01)
G11C 16/04    (2006.01)

(52) U.S. Cl. ............. 365/235; 365/185.28; 365/185.29

(58) Field of Classification Search ................ 365/235, 365/185.28, 185.29, 185.12, 238.5, 240
See application file for complete search history.

(56) References Cited

U.S. PATENT DOCUMENTS

| | | | |
|---|---|---|---|
| 5,999,451 A | 12/1999 | Lin et al. ................ 365/185.11 |
| 6,400,603 B1 * | 6/2002 | Blyth et al. ............. 365/185.12 |
| 6,714,453 B1 * | 3/2004 | Cavaleri et al. ........ 365/185.12 |
| 6,826,116 B1 * | 11/2004 | Noda et al. .............. 365/238.5 |
| 6,839,285 B1 * | 1/2005 | Zink et al. ............. 365/185.33 |
| 2001/0017789 A1 | 8/2001 | Noda ..................... 365/185.12 |

FOREIGN PATENT DOCUMENTS

EP    1 134 746 A2    9/2001

* cited by examiner

*Primary Examiner*—Anh Phung
(74) *Attorney, Agent, or Firm*—Lisa K. Jorgenson; David V. Carlson; Seed IP Law Group PLLC (57) ABSTRACT

The present invention relates to a memory in integrated circuit comprising a central Flash-type memory comprising memory cells forming pages, a buffer memory capable of storing binary words, and a sequencer for executing an instruction for saving, in a target page of the Flash memory, a series of external words received at an input terminal of the memory. According to the present invention, the sequencer is arranged for, after saving the series of external words in the buffer memory, saving, in the buffer memory, internal words present in the target page and corresponding, due to their address in the page, to locations of words in the buffer memory that have not received any external words, then erasing the target page and saving in the erased page the words present in the buffer memory.

24 Claims, 4 Drawing Sheets

WORD-PROGRAMMABLE FLASH MEMORY

BACKGROUND OF THE INVENTION

1. Field of the Invention

The present invention relates to a memory in integrated circuit comprising a central Flash-type memory comprising memory cells forming pages each capable of receiving a plurality of words, a buffer memory and a sequencer for executing an instruction for saving, in a target page of the Flash memory, a series of external words received at an input terminal of the memory, by first of all saving the series of external words in the buffer memory.

2. Description of the Related Art

This Flash memory is particularly described in European patent application EP 1 111 621 and is marketed by the applicant under various product references.

As explained in the above-mentioned patent application, conventional Flash memories have the disadvantage that the number of memory cells that can be programmed simultaneously is low, due to the high programming current that the programming of each memory cell, by injection of hot electrons, requires. Thus, the number of binary words that can be simultaneously saved in a Flash memory is low, and much lower than the number of words that one page of the memory can receive. For a better understanding, the number of binary words that can be saved simultaneously in a Flash memory is generally one to two words of 8 bits each (bytes), i.e., 8 or 16 memory cells programmed simultaneously, while one page can classically receive 256 words.

Providing a buffer memory makes it possible to simulate a page-programming mode, by saving on the fly, in the buffer memory, a series of words received, and by subsequently programming the Flash memory, in a manner transparent to the user.

Figure 1:
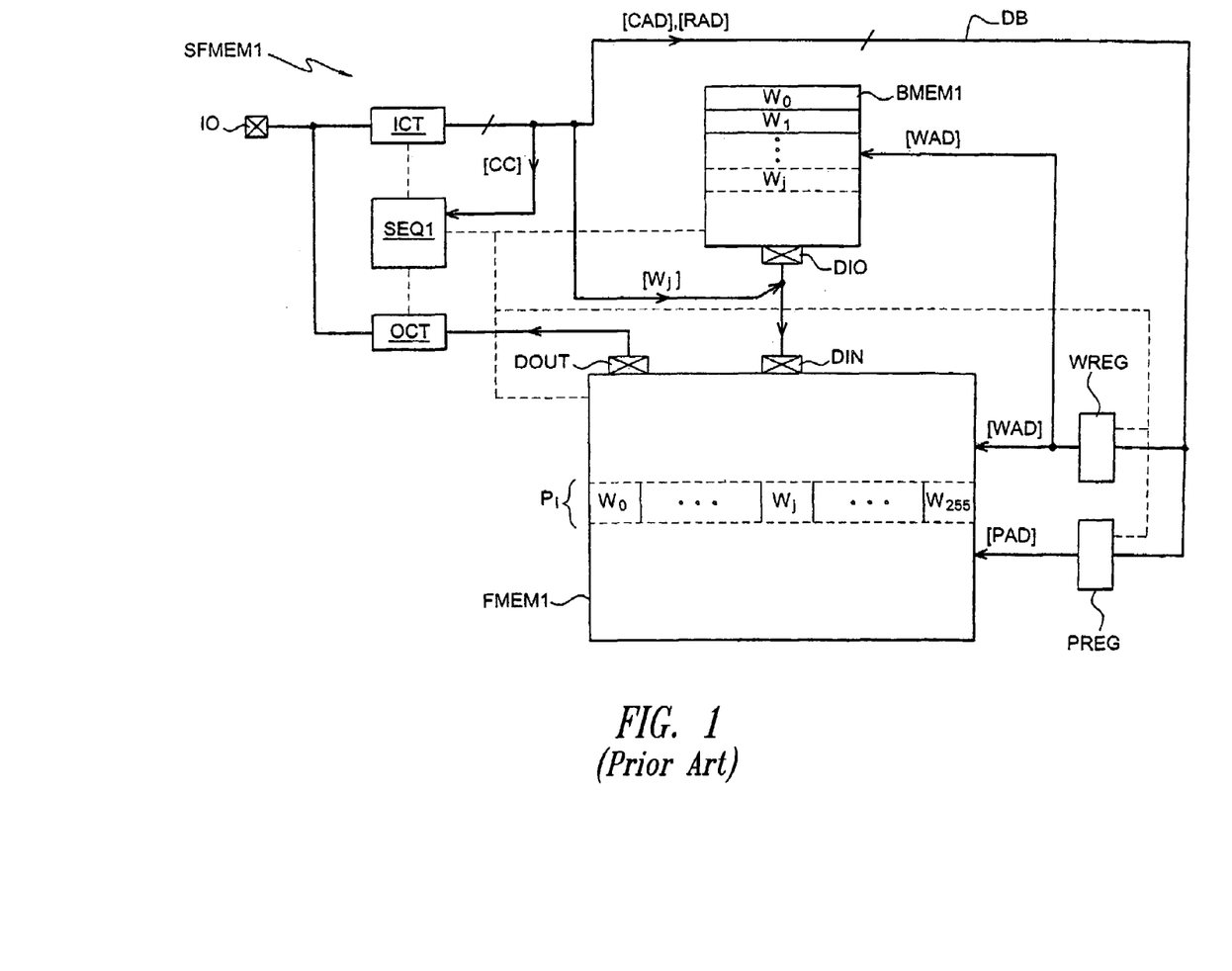
FIG. 1 described above schematically represents the architecture of a classical page-programmable Flash memory, FIG. 2 schematically represents the architecture of a Flash memory according to the present invention, which is word-programmable, FIG. 3 schematically represents the architecture of a buffer memory present in the memory in FIG. 2, and FIG. 4 schematically represents the architecture of a central Flash-type memory present in the memory in FIG. 2.

FIG. 1 schematically represents the architecture of a memory SFMEM1 of the type indicated above.

The memory SFMEM1 is here a serial Flash memory comprising a serial input/output terminal IO, an input interface circuit ICT, an output interface circuit OCT, a parallel data bus DB, a micro-programmed sequencer SEQ1, a buffer memory BMEM1, a central Flash-type memory FMEM1 that is sector-erasable and word-programmable, a page address register PREG and a word address register WREG. The terminal IO is connected to the input of the circuit ICT and to the output of the circuit OCT. The register WREG is connected at input to the bus DB and its output is connected to an address input of the memory FMEM1 (least significant bits of the address input) as well as to an address input of the buffer memory BMEM1. The register PREG is connected at input to the bus DB and its output is connected to the address input of the memory FMEM1 (most significant bits of the address input). The buffer memory BMEM1 comprises a data input/output DIO connected to the bus DB. The memory FMEM1 comprises a data input DIN connected to the input/output DIO of the buffer memory and a data output DOUT connected to the input of the interface circuit OCT.

The circuit ICT transforms serial data received at the terminal IO into parallel data applied to the bus DB, while the circuit OCT transforms parallel data read in the memory FMEM1 into serial data applied to the terminal IO. The incoming data comprise command codes (read, write), addresses, and words to be saved in the Flash memory.

An operation of writing a series of words in a determined page, or target page, of the central memory FMEM1, is obtained by applying to the memory a command for erasing the sector in which the target page is located, then a command for writing the series of words that is, for example, in the following form:

$$[CC_{PWRITE}][PAD0][WAD0][W0][W1] \ldots [Wn]$$

and comprises a page write command code $CC_{PWRITE}$, the address PAD0 of the target page Pi, the address WAD0, in the target page Pi, of the first word W0 to be saved, the first word to be saved W0 and the following words W1 ... Wn.

The write command is executed by the sequencer SEQ1, which controls the various elements of the memory. The page address PAD is loaded into the register PREG and is applied to the address input of the memory FMEM1. The word address WAD is loaded into the register WREG and is applied to the address input of the Flash memory FMEM1 and to an address input of the buffer memory BMEM1. The words received W0 to Wn are saved one after the other in the buffer memory BMEM1, while incrementing the word address WAD every time. The time for saving in the buffer memory is short and everything happens for the user as if the series of words were being loaded into the programming latches of a page-programmable memory. The words are then transferred one after the other (or by group of two) into the target page of the memory FMEM1, in a series of programming steps controlled by the sequencer which involve the programming latches and are transparent to the user.

This Flash memory simulating the page mode provides possibilities of use that are similar to those offered by page-programmable EEPROM memories.

However, generally speaking, a page-programmable EEPROM memory is also word-programmable, since each group of memory cells forming a word in this memory can be individually erase-selected by means of a gate control transistor. Therefore, when a word or a group of words must be saved in an EEPROM memory, only the memory cells corresponding to this word or to this group of words are erased.

Conversely, in the Flash memory described above, the page is erased before saving the words present in the buffer memory, and all the data present in the page are lost.

Thus, before applying a command to the Flash memory for saving a series of words, the user must perform a complete read of the sector to insert the series of words to be changed into it, then re-save the entire sector page by page.

BRIEF SUMMARY OF THE INVENTION

The present invention aims to overcome this disadvantage.

More particularly, the present invention aims to provide a Flash memory that offers a word-programming mode, i.e., which guarantees to the user that a series of words supplied by the user will be saved in the memory without the other words of the target page being erased.

To achieve this object, the idea of the present invention is to save in the buffer memory the internal words present in the target page, except for those that must be overwritten by the external words already present in the buffer memory, and to only erase the page after back-up saving these internal words in the buffer memory.

Another idea of the present invention is to use a central Flash memory of the page-erasable type, implementing the selective page erase method described in the international application WO 02/41322. Thus, when a word is saved, only the target page is erased during the erasing step and the data present in the other pages do not have to be saved, which allows the size of the buffer memory to be considerably reduced.

More particularly, the present invention provides a memory in integrated circuit, comprising a central Flash-type memory comprising memory cells forming pages each capable of receiving a plurality of words, a buffer memory and a sequencer for executing an instruction for saving, in a target page of the Flash memory, a series of external words received at an input terminal of the memory, by first of all saving the series of external words in the buffer memory, wherein the sequencer is arranged for, after saving the series of external words in the buffer memory: saving, in the buffer memory, internal words present in the target page and corresponding, due to their address in the target page, to locations of words in the buffer memory that have not received any external words, erasing the target page, and saving, in the erased target page, the words present in the buffer memory, comprising external words and the internal words saved before erasing the target page.

According to one embodiment, the central Flash memory is of the page-erasable type, and the sequencer is arranged for erasing the target page without erasing other pages of the memory.

According to one embodiment, the buffer memory comprises means for adding a priority bit having a determined value to each external word saved in the buffer memory.

According to one embodiment, the sequencer is arranged for: reading the entire target page, saving, in the buffer memory, each internal word read in the target page if the priority bit of the word present in the buffer memory at the corresponding word address does not have the determined value.

According to one embodiment, the buffer memory comprises means for inhibiting the saving of an internal word in the buffer memory when a save command is applied to the buffer memory, if the priority bit of the word present in the buffer memory at the word address targeted has the determined value.

According to one embodiment, the priority bits present in the buffer memory are taken to a logic value that is the opposite of the determined logic value, before a series of external words is saved in the buffer memory.

According to one embodiment, the buffer memory is erased before a series of external words is saved.

According to one embodiment, the memory comprises a serial/parallel interface circuit for receiving external words to be saved in the Flash memory, addresses, and commands for saving, erasing or reading the Flash memory.

According to one embodiment, the memory comprises registers for applying, to address inputs of the Flash memory, an address of the target page and a word address, and for applying the word address to an address input of the buffer memory.

According to one embodiment, the words present in the buffer memory are saved individually in the Flash memory or by groups of two or four words.

The present invention also relates to a method for saving a series of external words in a target page of a Flash-type memory comprising memory cells forming pages each capable of receiving a plurality of words, comprising a prior step of saving the series of external words in a buffer memory, comprising the following steps: after saving the series of external words in the buffer memory, saving, in the buffer memory, internal words present in the target page and corresponding, due to their address in the target page, to locations of words in the buffer memory that have not received any external words, erasing the target page, and saving, in the erased target page, the words present in the buffer memory, comprising external words and the internal words saved before erasing the target page.

According to one embodiment, the target page is erased without erasing other pages of the Flash memory.

According to one embodiment, the method comprises a step of adding a priority bit having a determined value to each external word saved in the buffer memory.

According to one embodiment, the method comprises the following steps: reading the entire target page, saving, in the buffer memory, an internal word read in the target page if the priority bit of the word present in the buffer memory at the corresponding word address does not have the determined value.

According to one embodiment, the priority bits present in the buffer memory are taken to a logic value that is the opposite of the determined logic value, before saving a series of external words in the buffer memory.

According to one embodiment, the method comprises the application, to address inputs of the Flash memory, of an address of the target page and of a word address, and the application of the word address to an address input of the buffer memory.

According to one embodiment, the words present in the buffer memory are saved in the Flash memory by groups of words comprising two or four words.

BRIEF DESCRIPTION OF THE SEVERAL VIEWS OF THE DRAWING(S)

These and other objects, features and advantages of the present invention will be explained in greater detail in the following description of an example of an embodiment of a memory according to the present invention, given in relation with, but not limited to the following figures.

DETAILED DESCRIPTION OF THE INVENTION

Figure 2:
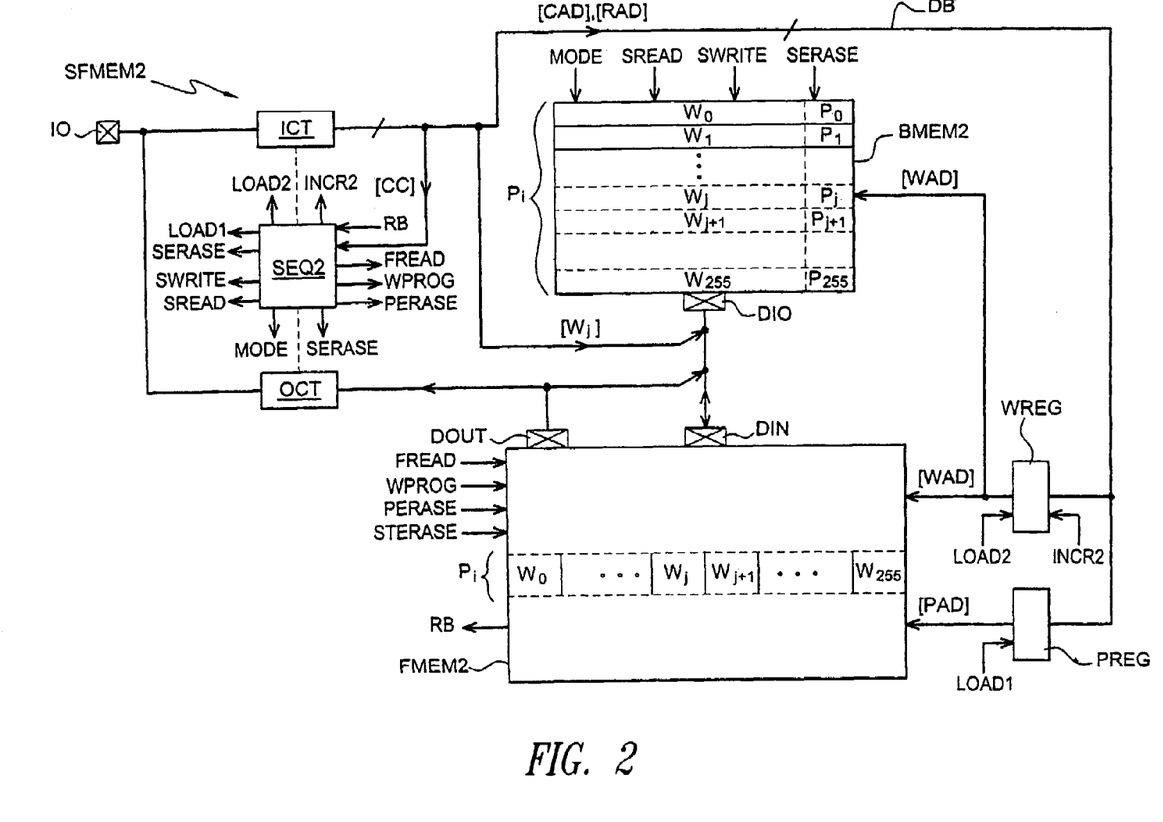

FIG. 2 schematically represents the architecture of a memory SFMEM2 according to the present invention, which is word-programmable. "Word-programmable" means the fact that, when a command for writing a series of words is applied to the memory and that the series of words comprises a number of words lower than the number of words that a page can receive, the series of words is saved in the target page without losing the other data present in the page. In a classical page-programmable memory like the one described above, a command for writing a series of words smaller in size than one page is also applicable, but results in the loss of the other data present in the page (Cf. the examples given in EP 1 111 621).

The memory SFMEM2 is a serial memory integrated onto a silicon micro-wafer (chip) and comprises a serial input/output terminal IO., a serial/parallel input interface circuit ICT, a parallel/serial output interface circuit OCT, a parallel data bus DB, a page address register PREG and a word address register WREG, these elements being classical per se and designated by the same references as in FIG. 1. The memory SFMEM2 also comprises a micro-programmed sequencer SEQ2, a buffer memory BMEM2, here of SRAM type, and an electrically erasable and programmable central memory FMEM2, of Flash type. The circuit ICT is connected at input to the terminal IO and its output is connected to the bus DB. The circuit OCT is connected at input to a parallel output DOUT of the memory FMEM2 and its output is connected to the terminal IO.

The register PREG is driven by a load signal LOAD1 and is connected at input to the bus DB. Its output is connected to an address input of the memory FMEM2 (most significant bits of the address input).

The register WREG is driven by a load signal LOAD2 and by an increment signal INCR2, and is connected at input to the bus DB. Its output is connected to the address input of the memory FMEM2 (least significant bits of the address input) and to an address input of the buffer memory BMEM2.

The buffer memory BMEM2 comprises a data input/output DIO connected to the bus DB and the memory FMEM2 comprises a data input DIN connected to the input/output DIO of the buffer memory.

According to the present invention, the output DOUT of the memory FMEM2 is also connected to the input/output DIO of the buffer memory.

Preferably, the memory FMEM2 is of the page-erasable type and implements the selective page erase method described in the international application WO 02/41322 (erasing of the memory cells by the source or by the channel, and application of an erase-inhibiting voltage to the gates of the memory cells belonging to the pages that must not be erased). Therefore, in addition to a sector erase command STERASE, a read command FREAD and a word programming command WPROG, the memory FMEM2 can also receive a page erase command PERASE.

The buffer memory BMEM2 receives a write command SWRITE, a read command SREAD and a global erase command SERASE. According to the present invention, the buffer memory also receives a MODE signal that can have a first logic value, such as 1 for example, corresponding to a mode "USER", and a second logic value, such as 0 for example, corresponding to a mode "BACKUP". At each word location Wj, the buffer memory comprises an additional memory cell provided for receiving a priority bit pj that is added to the word when it is saved in the buffer memory, when the latter is in the USER mode, the active value of the priority bit being 0 for example.

It is assumed here that each page Pi of the memory FMEM2 can receive 256 words W0 to W255. In this case, the buffer memory BMEM2 comprises at least 256 memory locations for receiving these words, each word location comprising an additional memory cell for receiving a priority bit. In practice, the buffer memory can have other memory areas that will not be described here, intended for example for the storage of management data by the sequencer SEQ2.

A command for programming a word or a series of words in a page is sent to the memory in the following form:

[CC$_{WWRITE}$][PAD][WAD][W0][W1] ... [Wn]

and comprises a word write command code CC$_{WWRITE}$, the address PAD of the target page, the address WAD, in the target page, of the first word W0 to be saved, the first word to be saved W0 and the following words W1 ... Wn. This command is executed by the sequencer SEQ2 in accordance with the method according to the present invention.

It will be assumed here as an example that a command for writing two words Wj, Wj+1, having for respective addresses WADj, WADj+1 in a page Pi of address PADi, is sent to the memory:

[CC$_{WWRITE}$][PADi][WADj][Wj][Wj+1]

The command code CC$_{WWRITE}$ is read by the sequencer. The page address PADi is loaded into the register PREG and is applied to the address input of the memory FMEM2. The address WADj of the first word Wj is loaded into the register WREG and is applied to the address input of the Flash memory FMEM2 (least significant bits) and to the address input of the buffer memory BMEM2. The buffer memory is then erased. All the words that are located there are thus taken to their erased value, such as FF for example (in hexadecimal notation) and the priority bits are set to 1 (value of an erased bit). The buffer memory is then placed in the "USER" mode (MODE=1), and the words Wj, Wj+1 received one after the other via the serial terminal IO are saved in the buffer memory BMEM2 while incrementing the register WREG so that the address applied to the buffer memory changes from the address WADj to the address WADj+1. Upon each save of a word, the corresponding priority bit is set to 0 (active value). The buffer memory is then placed in the "BACKUP" mode, the address register WREG is set to 0, the page Pi of the memory is read starting with the first word W0 and up to the last word W255. Each word read is supplied on the data bus DB and is saved in the buffer memory BMEM2 by applying the command SWRITE. Inside the buffer memory, a logic control circuit saves the internal word read in the target page if and only if the priority bit located at the corresponding address has the non-active value (1). Therefore, when internal words of address WADj, WADj+1 are read in the page Pi and the sequencer applies the write command to the buffer memory, these words are not saved by the buffer memory since the external words Wj, Wj+1 saved in USER mode are there. The corresponding priority bits pj, pj+1, that are on 0 (active value), tell the buffer memory that these words are not to be overwritten.

When all is said and done, the entire content of the page Pi finds itself transferred to the buffer memory, except for the words that must be replaced by the external words Wj, Wj+1 saved beforehand.

The page Pi is then erased by applying a command PERASE to the Flash memory FMEM2, and the content of the buffer memory BMEM2 is transferred word by word into the Flash memory. Tables 1 to 3 below show the steps that have just been described. Table 1 describes the content of the buffer memory after it has been erased. Table 2 describes the content of the buffer memory after loading the two external words Wj, Wj+1, the value "EXTVALUE" of which is between 00 and FF. Table 3 describes the content of the buffer memory after loading the internal words present in the page Pi, the value "INTVALUE" of which is also between 00 and FF. As the buffer memory is transferred into the Flash memory, table 3 also represents the content of the page Pi at the end of the process of programming the Flash memory.

TABLE 1

(after erasing the buffer memory)

| Word address | Word | Value of the word | Priority bit |
|---|---|---|---|
| WAD0 | W0 | FF | 1 |
| ... | ... | FF | 1 |
| WADj−1 | Wj−1 | FF | 1 |
| WADj | Wj | FF | 1 |
| WADj+1 | Wj+1 | FF | 1 |
| WADj+2 | Wj+2 | FF | 1 |
| ... | ... | FF | 1 |
| WAD255 | W255 | FF | 1 |

TABLE 2

(after loading the words Wj, Wj+1 in USER mode)

| Word address | Word | Value of the word | Priority bit |
|---|---|---|---|
| WAD0 | W0 | FF | 1 |
| ... | ... | FF | 1 |
| WADj−1 | Wj−1 | FF | 1 |
| WADj | Wj | EXTVALUE | 0 |
| WADj+1 | Wj+1 | EXTVALUE | 0 |
| WADj+2 | Wj+2 | FF | 1 |
| ... | ... | FF | 1 |
| WAD255 | W255 | FF | 1 |

TABLE 3

(after saving the page Pi in BACKUP mode)

| Word address | Word | Value of the word | Priority bit |
|---|---|---|---|
| WAD0 | W0 | INTVALUE | 1 |
| ... | ... | INTVALUE | 1 |
| WADj−1 | Wj−1 | INTVALUE | 1 |
| WADj | Wj | EXTVALUE | 0 |
| WADj+1 | Wj+1 | EXTVALUE | 0 |
| WADj+2 | Wj+2 | INTVALUE | 1 |
| ... | ... | INTVALUE | 1 |
| WAD255 | W255 | INTVALUE | 1 |

The method according to the present invention therefore allows the word-programming mode of EEPROM memories to be simulated, and is not destructive for the other data present in the target page.

This method can be applied whatever the number of external words. An instruction for saving a series of words may comprise only a single word to be saved. On the contrary, the series of external words can comprise as many words as the target page can receive. In this case, no internal datum present in this page is saved in the buffer memory, since all the internal words are overwritten by external words.

Figure 3:
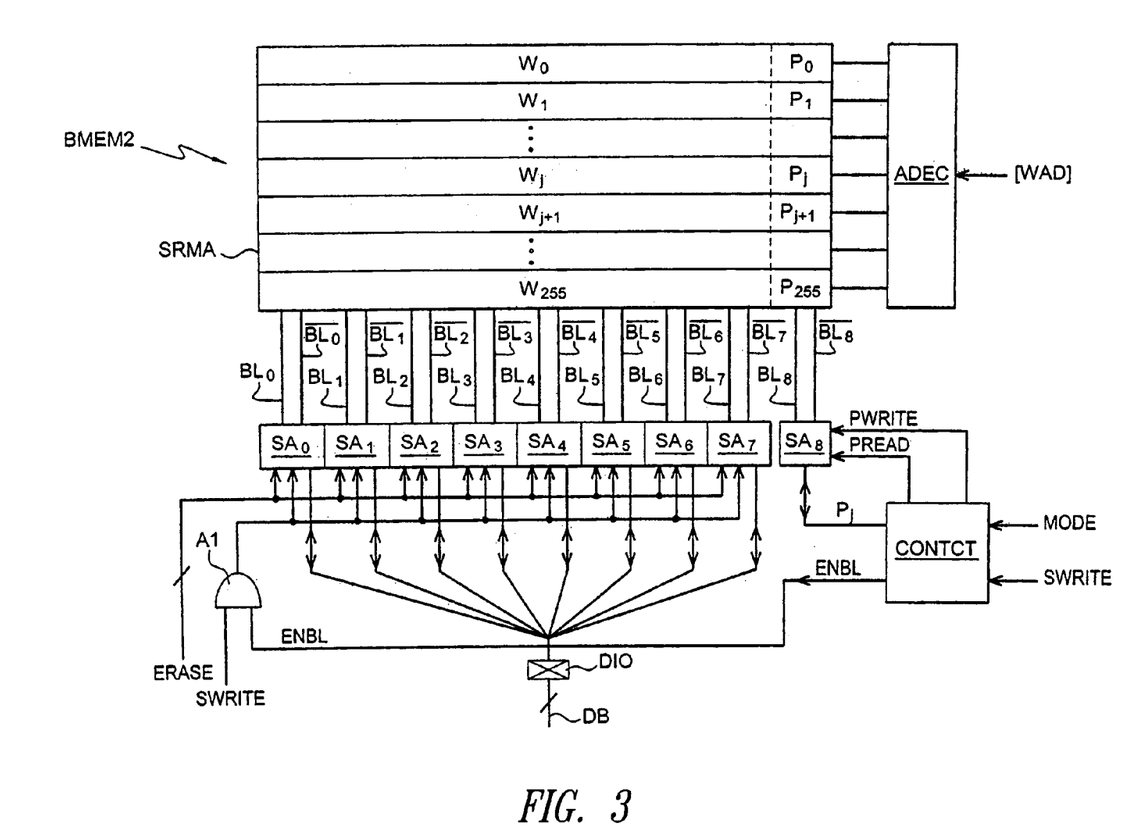

FIG. 3 represents an example of an embodiment of the buffer memory BMEM2. The buffer memory comprises a memory array SRMA of SRAM type, comprising 256 word lines for receiving the 256 words of a page, and 9 bit lines for receiving the eight bits of each word W0 to W225 as well as the priority bit p0 to p255 associated with each word. In a classical manner, each bit line is double and comprises a non-inverting bit line BL0 to BL8 and an inverting bit line /BL0 to /BL8.

The word lines are selected by an address decoder ADEC receiving the word address WAD. Each double bit line BL0 to BL8 is linked to a sense amplifier SA0 to SA8 that reads or writes a bit in a memory cell of the word line selected by the decoder ADEC.

The amplifiers SA0 to SA7 each comprise an input/output linked to the data bus DB via the input/output DIO, and receive the words to be saved in the buffer memory or supply words read in the buffer memory. They directly receive the read signal SREAD and receive the write signal SWRITE through a logic gate Al of AND type, which receives an enabling signal ENBL at another input.

The amplifier SA8 is reserved for the management of the priority bit and is associated with a control circuit CONTCT that is linked to the input/output of the amplifier SA8, for saving a priority bit or reading a priority bit in one of the additional memory cells, by applying specific commands PWRITE (writing the priority bit) and PREAD (reading the priority bit) to this amplifier. Therefore, the priority bits do not circulate on the data bus, they remain in the buffer memory and only allow the external words to be identified during the back-up save of the target page.

The circuit CONTCT receives the signal MODE and the signal SWRITE, and sends the enabling signal ENBL. When the signal MODE is on 1 (USER mode), the circuit CONTCT maintains the signal ENBL on 1, such that the buffer memory is read or written like a classical memory SRAM. However, when a word is written in the buffer memory in USER mode, the circuit CONCT supplies a priority bit on 0 to the amplifier SA8 and applies the write command PWRITE to it.

When the signal MODE is on 0 (BACKUP mode) and the circuit CONTCT receives the write signal SWRITE, the circuit CONTCT applies the read command PREAD to the amplifier SA8, then sets the enabling signal ENBL to 1 if the priority bit read by the amplifier SA8 is equal to 1 (non-active value). In this case, the gate Al becomes transparent and the write signal SWRITE is applied to the amplifiers SA0 to SA7. If the priority bit is on 0, the signal ENBL remains on 0 and the word present on the data bus is not saved in the buffer memory, despite the fact that the signal SWRITE is applied to it.

Providing these priority bits and managing them by the buffer memory are advantageous means whereby the method according to the present invention can easily be implemented. However, those skilled in the art will be capable of providing other means whereby the external words will not be overwritten during the back-up save of the target page. For example, the sequencer can use an index of the addresses of the external words loaded into the buffer memory and not apply the instruction for writing the buffer memory, during the reading of the target page, when the addresses of the internal words read in the target page are included in this index.

Figure 4:
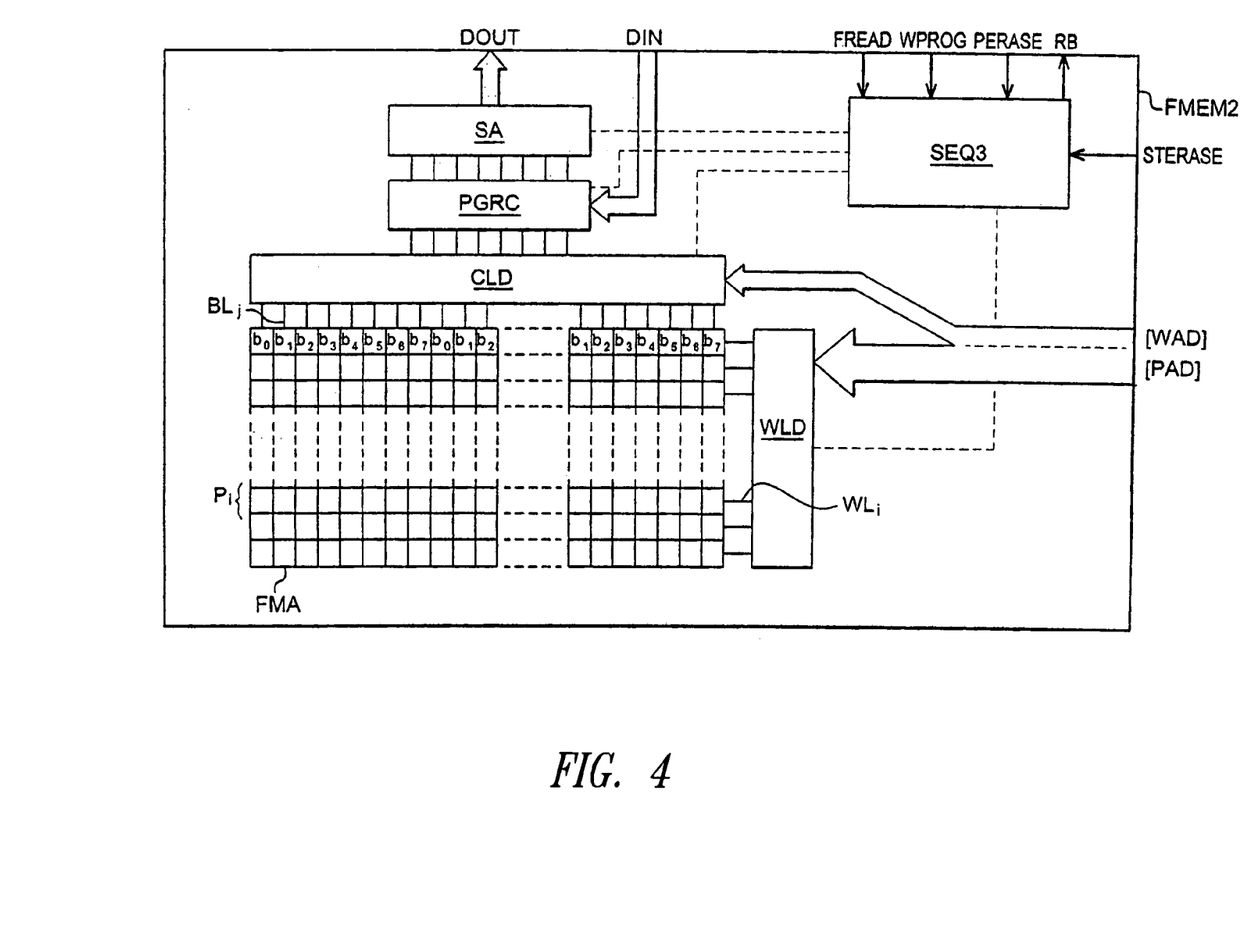

FIG. 4 schematically represents an example of architecture of a Flash memory FMEM2, that is word-programmable and page-erasable. The memory FMEM2 comprises a Flash memory array, a line decoder WLD connected to word lines $WL_i$ of the memory array, a column decoder CLD connected to bit lines $BL_j$ of the memory array, as well as a read circuit SA and a programming buffer register PGRC connected to the column decoder CLD. The memory array FMA comprises for example 256 sectors of 256 pages each, each page comprising 256 words, each word comprising 8 memory cells.

At its address input, the memory FMEM2 receives an address of 24 bits comprising sixteen most significant bits forming the page address PAD (word line address) and eight least significant bits forming the word address WAD (column address). The address PAD is applied to a word line decoder WLD and the address WAD is applied to a column decoder CLD.

The read circuit SA delivers in parallel, to the output DOUT of the memory FMEM2, the eight bits of a word read in the memory array. Furthermore, the eight bits of a word to be programmed are received in parallel at the input DIN of the memory FMEM2 and are applied to the programming buffer register PGRC. The register PGRC classically comprises a series of high-voltage programming latches each receiving one bit of the word to be programmed and delivering a high programming voltage Vpp when the bit received is equal to "0". The voltage Vpp, in the order of 5 to 6 V, propagates into the corresponding bit lines of the memory array FMA to bias the drains of the transistors to be programmed while another voltage Vpp of higher value is applied to the gates of the transistors. The storage capacity of the register PGRC is of one and only one word, here one byte.

These various circuits, registers and decoders are controlled and activated by a sequencer SEQ3. The sequencer SEQ3 executes an operation of reading a byte upon receiving the signal FREAD, executes an operation of programming a byte upon receiving the signal WPROG, and executes an operation of erasing a sector or an operation of erasing a page upon receiving the signal STERASE or PERASE. The sequencer SEQ3 delivers a signal RB (Ready/Busy) equal to "1" during these operations, for synchronizing the memory FMEM2 with the sequencer SEQ2 (FIG. 2).

After erasing a page, the memory FMEM2 can only program one word at a time for technological reasons mentioned in the preamble. The word is presented at the input DIN and the signal WPROG is applied to the memory FMEM2.

The process of transferring the buffer memory into the Flash memory FMEM2 is therefore performed word by word and can be implemented in accordance with the indications supplied in application EP 1 111 621. However, the words can also be transferred by groups of two or even four words in parallel, if the Flash memory is provided for that purpose. In this case, two or three buffer memories are provided in parallel and the number of wires of the data bus is increased to comprise 16 or 24 bits (if the words are bytes) so as to allow groups of two or three words to be programmed simultaneously.

The invention claimed is:

1. A memory in integrated circuit comprising:
a central Flash-type memory comprising memory cells forming pages each capable of receiving a plurality of words,
a buffer memory, and
a sequencer for executing an instruction for saving, in a target page of the Flash memory, a series of external words received at an input terminal of the memory, by first of all saving the series of external words in the buffer memory,
characterized in that the sequencer is arranged for, after saving the series of external words in the buffer memory:
saving, in the buffer memory, internal words present in the target page and corresponding, due to their address in the target page, to locations of words in the buffer memory that have not received any external words,
erasing the target page, and
saving, in the erased target page, the words present in the buffer memory, comprising external words and the internal words saved before erasing the target page.

2. The memory according to claim 1, wherein the central Flash memory is of the page-erasable type, and the sequencer is arranged for erasing the target page without erasing other pages of the memory.

3. The memory according to claim 1, wherein the buffer memory comprises means for adding a priority bit having a determined value to each external word saved in the buffer memory.

4. The memory according to claim 3, wherein the sequencer is arranged for:
reading the entire target page,
saving, in the buffer memory, each internal word read in the target page if the priority bit of the word present in the buffer memory at the corresponding word address does not have the determined value.

5. The memory according to claim 3, wherein the buffer memory comprises means for inhibiting the saving of an internal word in the buffer memory when a save command is applied to the buffer memory, if the priority bit of the word present in the buffer memory at the word address targeted has the determined value.

6. The memory according to claim 3, wherein the priority bits present in the buffer memory are taken to a logic value that is the opposite of the determined logic value, before a series of external words is saved in the buffer memory.

7. The memory according to claim 6, wherein the buffer memory is erased before a series of external words is saved.

8. The memory according to claim 1, comprising a serial/parallel interface circuit for receiving external words to be saved in the Flash memory, addresses, and commands for saving, erasing or reading the Flash memory.

9. The memory according to claim 1, comprising registers for applying, to address inputs of the Flash memory, an address of the target page and a word address, and for applying the word address to an address input of the buffer memory.

10. The memory according to claim 1, wherein the words present in the buffer memory are saved individually in the Flash memory or by groups of two or four words.

11. A method for saving a series of external words in a target page of a Flash-type memory comprising memory cells forming pages each capable of receiving a plurality of words, comprising a prior step of saving the series of external words in a buffer memory,
characterized in that it comprises the following steps:
after saving the series of external words in the buffer memory, saving, in the buffer memory, internal words present in the target page and corresponding, due to their address in the target page, to locations of words in the buffer memory that have not received any external words,
erasing the target page, and
saving, in the erased target page, the words present in the buffer memory, comprising external words and the internal words saved before erasing the target page.

12. The method according to claim 11, wherein the target page is erased without erasing other pages of the Flash memory.

13. The method according to claim 11, comprising a step of adding a priority bit having a determined value to each external word saved in the buffer memory.

14. The method according to claim 13, comprising the following steps:
   reading the entire target page,
   saving, in the buffer memory, an internal word read in the target page if the priority bit of the word present in the buffer memory at the corresponding word address does not have the determined value.

15. The method according to claim 13, wherein the priority bits present in the buffer memory are taken to a logic value that is the opposite of the determined logic value, before saving a series of external words in the buffer memory.

16. The method according to claim 11, comprising the application, to address inputs of the Flash memory, of an address of the target page and of a word address, and the application of the word address to an address input of the buffer memory.

17. The method according to claim 11, wherein the words present in the buffer memory are saved in the Flash memory by groups of words comprising two or four words.

18. A memory integrated in a semiconductor chip, comprising:
   a flash memory having memory cells forming pages, each page capable of receiving a plurality of words;
   a buffer memory capable of receiving at least as many words as each page of the flash memory; and
   a sequencer for controlling the flash memory and the buffer memory to execute an instruction for saving a series of external words and internal words in a target page of the flash memory, the sequencer allowing the flash memory to operate in a word-programming mode.

19. The memory of claim 18, wherein the flash memory is of the page-erasable type, and the sequencer is arranged for erasing the target page without erasing other pages of the flash memory.

20. The memory of claim 18, wherein the sequencer is arranged for:
   erasing the buffer memory;
   saving, in the buffer memory, the series of external words;
   saving, in the buffer memory, internal words present in the target page and corresponding, due to their address in the target page, to locations of words in the buffer memory that have not received external words;
   erasing the target page of the flash memory; and
   saving, in the erased target page, the words present in the buffer memory.

21. The memory of claim 1, wherein the buffer memory is of SRAM type.

22. The memory of claim 18, wherein the buffer memory adds a priority bit to each received word.

23. A method of saving a series of external words in a target page of a flash memory having memory cells forming pages, each page capable of receiving a plurality of words, comprising:
   erasing a buffer memory;
   saving, in the buffer memory, the series of external words;
   saving, in the buffer memory, internal words present in the target page and corresponding, due to their address in the target page, to locations of words in the buffer memory that have not received external words;
   erasing the target page of the flash memory; and
   saving, in the erased target page, the words present in the buffer memory.

24. The method of claim 22, wherein the flash memory is of the page-erasable type, so that the target page is erased without erasing other pages of the flash memory.

* * * * *